United States Patent
Kanaya

(10) Patent No.: US 9,076,720 B2
(45) Date of Patent: Jul. 7, 2015

(54) MAGNETIC RANDOM ACCESS MEMORY AND A METHOD OF FABRICATING THE SAME

(71) Applicant: Kabushiki Kaisha Toshiba, Tokyo (JP)

(72) Inventor: Hiroyuki Kanaya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/051,404

(22) Filed: Oct. 10, 2013

(65) Prior Publication Data

US 2014/0097477 A1    Apr. 10, 2014

Related U.S. Application Data

(63) Continuation of application No. 13/235,272, filed on Sep. 16, 2011, now abandoned.

(30) Foreign Application Priority Data

Feb. 2, 2011    (JP) .................. 2011-021210

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 27/22 | (2006.01) | |

(Continued)

(52) U.S. Cl.
CPC ............... *H01L 27/228* (2013.01); *G11C 11/16* (2013.01); *H01L 43/12* (2013.01)

(58) Field of Classification Search
CPC ............ H01L 21/0228; H01L 27/1023; H01L 29/6684
USPC ......... 257/295, 296, 297, 288, 396, 421, 744, 257/E21.006, E21.17, E21.218, E21.231, 257/E21.304, E21.645, E21.646
See application file for complete search history.

(56) References Cited

U.S. PATENT DOCUMENTS

| | | |
|---|---|---|
| 6,714,444 B2 | 3/2004 | Huai et al. |
| 6,765,821 B2 | 7/2004 | Saito et al. |

(Continued)

FOREIGN PATENT DOCUMENTS

| | | |
|---|---|---|
| JP | 2004-128011 | 4/2004 |
| JP | 2004-214459 | 7/2004 |

(Continued)

OTHER PUBLICATIONS

Office Action dated Jan. 31, 2014 received in Japanese Patent application No. 2011-021210.

*Primary Examiner* — David Nhu
(74) *Attorney, Agent, or Firm* — Knobbe Martens Olson & Bear LLP

(57) ABSTRACT

An aspect of the present embodiment, there is provided magnetic random access memory device including a semiconductor substrate, a selection transistor on the semiconductor substrate, the selection transistor including a diffusion layer, a contact plug on diffusion layer, an amorphous film on the contact plug, a lower electrode provided on the amorphous film, a first magnetic layer, a nonmagnetic layer, a second magnetic layer, an upper electrode stacked in an order and a sidewall contact film on the contact plug, the sidewall contact film being in contact with a sidewall of the upper electrode.

12 Claims, 8 Drawing Sheets

(51) Int. Cl.
 *G11C 11/16* (2006.01)
 *H01L 43/12* (2006.01)

(56) References Cited

U.S. PATENT DOCUMENTS

| | | |
|---|---|---|
| 6,982,446 B2 | 1/2006 | Motoyoshi |
| 7,023,725 B2 | 4/2006 | Saito et al. |
| 7,271,010 B2 | 9/2007 | Motoyoshi |
| 7,473,951 B2 * | 1/2009 | Kim et al. .................. 257/296 |
| 7,541,199 B2 * | 6/2009 | Bae et al. .................... 438/3 |
| 7,860,351 B2 | 12/2010 | Yagami |
| 8,000,126 B2 | 8/2011 | Morikawa et al. |
| 2004/0076035 A1 | 4/2004 | Saito et al. |
| 2004/0157427 A1 | 8/2004 | Motoyoshi |
| 2004/0223382 A1 | 11/2004 | Saito et al. |
| 2005/0068834 A1 | 3/2005 | Kim et al. |
| 2006/0023561 A1 | 2/2006 | Motoyoshi |

FOREIGN PATENT DOCUMENTS

| | | |
|---|---|---|
| JP | 2005-109477 | 4/2005 |
| JP | 2005-183579 | 7/2005 |

* cited by examiner

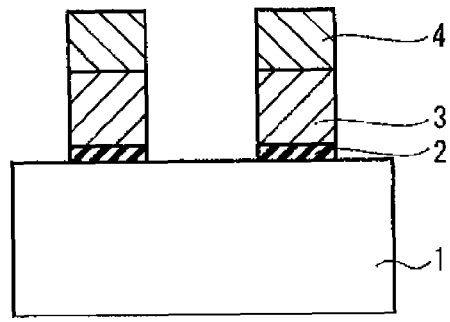
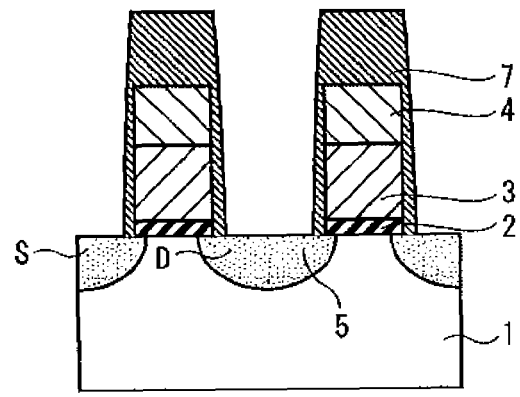
FIG.3A                FIG.3B
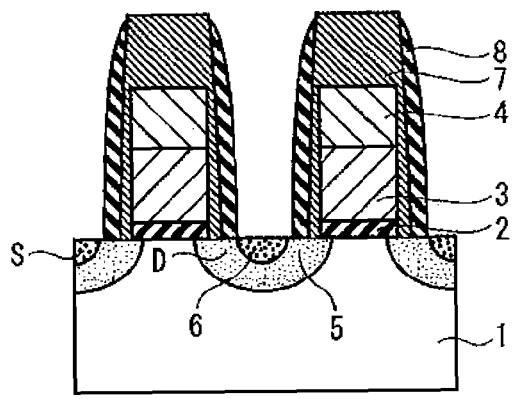
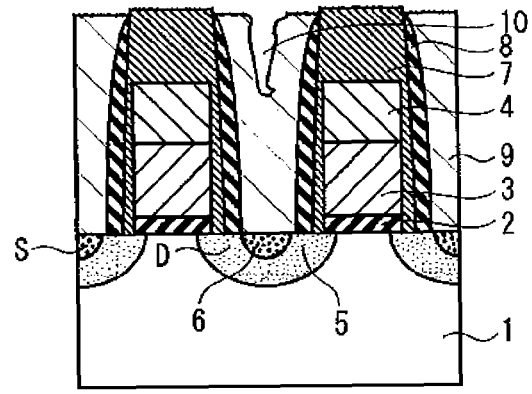
FIG.3C                FIG.3D

MAGNETIC RANDOM ACCESS MEMORY AND A METHOD OF FABRICATING THE SAME

CROSS REFERENCE TO RELATED APPLICATION

This application is a continuation of U.S. application Ser. No. 13/235,272, filed Sep. 16, 2011, which is based upon and claims the benefit of priority from prior Japanese Patent Application No. 2011-021210, filed on Feb. 2, 2011, the entire contents of both of which are incorporated herein by reference.

FIELD

Embodiments described herein generally relate to a magnetic random access memory device and a method of fabricating the magnetic random access memory device.

BACKGROUND

Recent years, MRAMs (Magnetic Random Access Memories) utilizing a TMR (Tunneling Magneto Resistive) effect have been developed. Having large magnetic resistance change ratios, magneto resistive elements including MTJs (Magnetic Tunnel Junctions) are used in MRAMs.

With the miniaturization of memory cells in MRAMs, a structure in which magneto resistive elements are provided on contact plugs is now being studied. In such a structure, the reliability of each magneto resistive element depends on the flatness of the corresponding contact plug.

Meanwhile, in the process of forming contact plugs in contact holes by CVD or the like, a film may not be formed evenly and a seam or void may be generated inside some contact plugs.

In this case, the contact plugs and magneto resistive elements on the contact plugs lose their surface flatness, causing a problem of degrading the reliability of the magneto resistive elements.

BRIEF DESCRIPTION OF THE DRAWINGS

FIGS. 3A-3D are cross-sectional views showing a method of fabricating the magnetic random access memory according to the first embodiment.

DETAILED DESCRIPTION

An aspect of the present embodiment, there is provided magnetic random access memory device including a semiconductor substrate, a selection transistor provided on the semiconductor substrate, the selection transistor including a diffusion layer on a surface area of the semiconductor substrate, a contact plug provided on the diffusion layer, an amorphous film provided on the contact plug, a lower electrode provided on the amorphous film, a first magnetic layer provided on the lower electrode, a nonmagnetic layer provided on the first magnetic layer, a second magnetic layer provided on the nonmagnetic layer, an upper electrode provided on the second magnetic layer, and a sidewall contact film provided on the contact plug, the sidewall contact film being in contact with a sidewall of the lower electrode.

Hereinbelow, embodiments will be described with reference to the drawings.
(First Embodiment)

Figure 1:
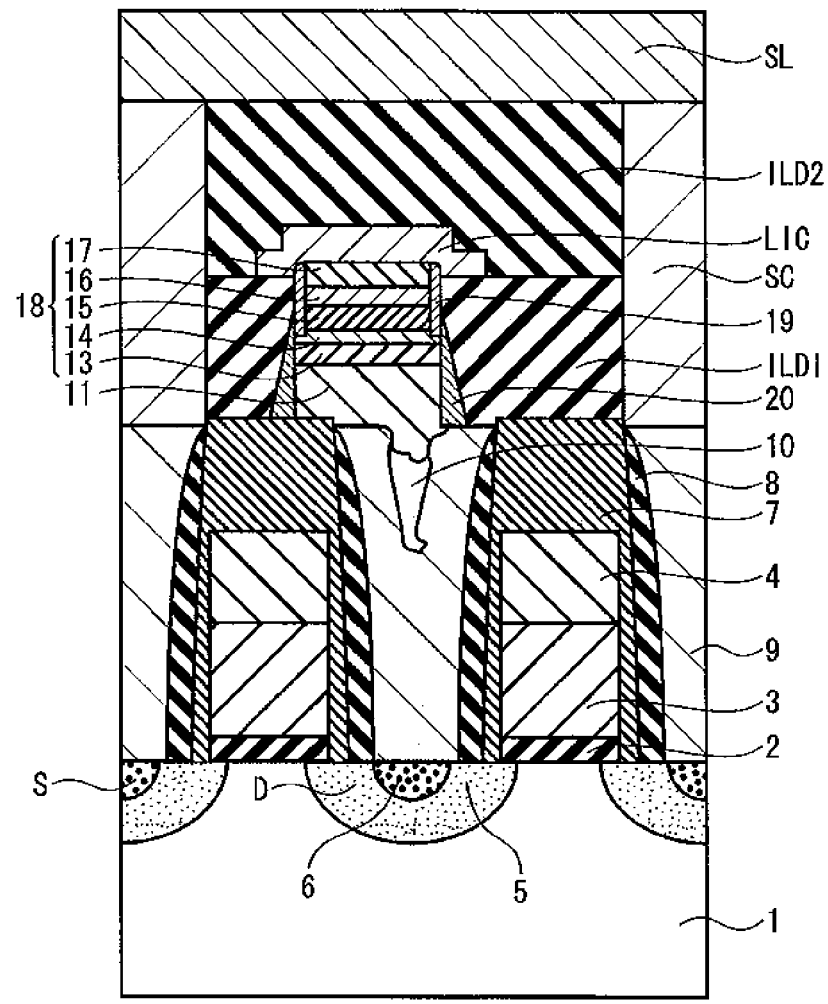
FIG. 1 is a cross-sectional view showing a memory cell in a magnetic random access memory according to a first embodiment.
Figure 2:
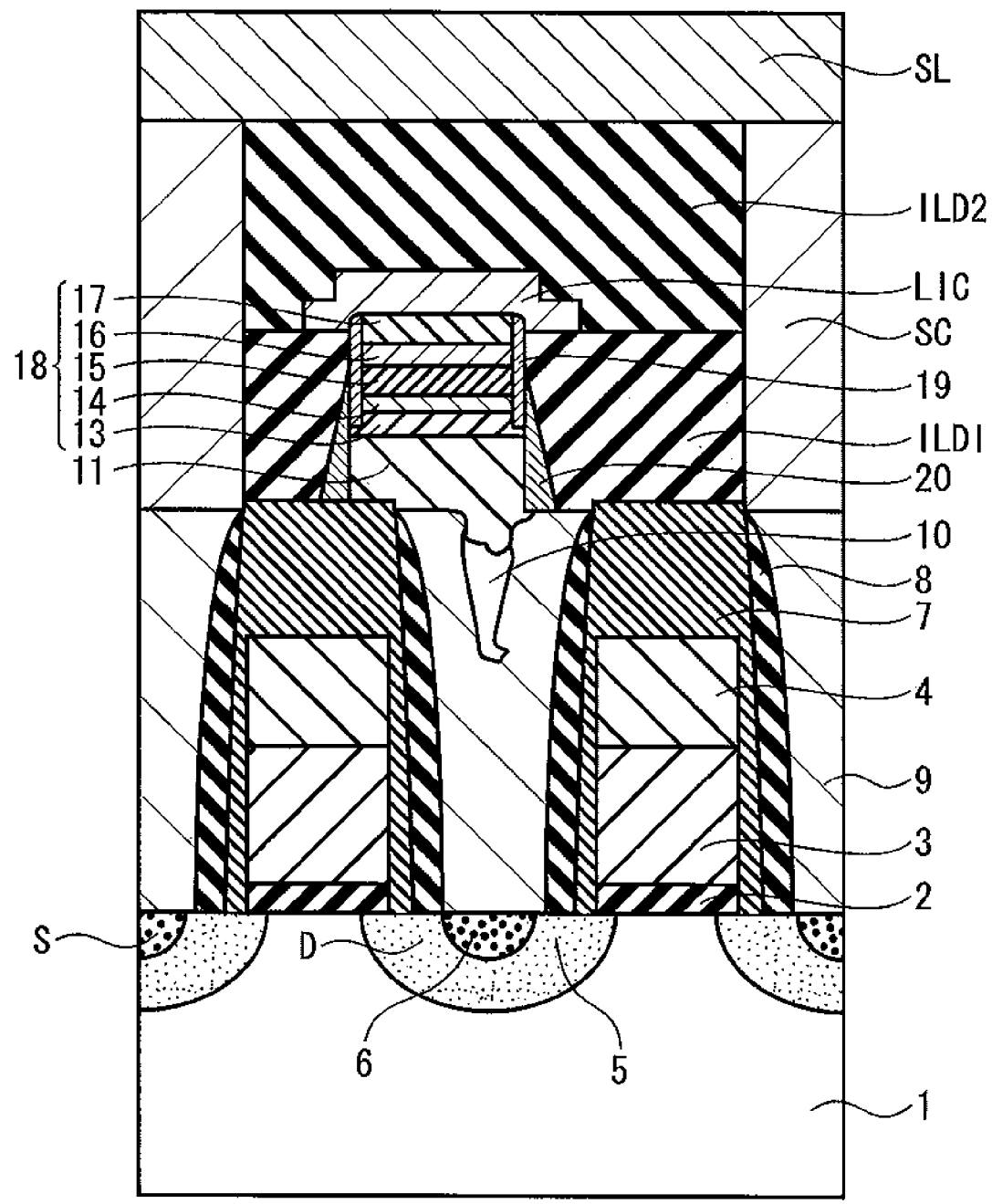
FIG. 2 is a cross-sectional view showing the memory cell in the magnetic random access memory according to the first embodiment.

A magnetic random access memory according to a first embodiment will be described below. FIGS. 1 and 2 are cross-sectional views showing a memory cell in the magnetic random access memory according to the first embodiment, taken along a line parallel to the bit line direction.

As shown in FIG. 1, a plurality of select transistors are provided on a semiconductor substrate 1. Each select transistor includes a source layer S, a drain layer D, a gate insulating film 2, and a gate electrode 3. Meanwhile, each pair of select transistors share a drain layer D with each other. That is, the select transistors are adjacent to each other with the drain layer D in between.

A p-type silicon substrate for example is used for the semiconductor substrate 1. The source layer S and the drain layer D are provided in upper layer portions of the semiconductor substrate 1 and are n-type diffusion layers for example. The drain layer D is constituted with an extension layer 5 and a high-concentration layer 6.

The gate insulating films 2 and the gate electrodes 3 are provided in order on the semiconductor substrate 1. A silicon oxide film for example is used for each gate insulating film 2. A polycrystalline silicon film or the like for example is used for each gate electrode 3. Word lines 4 are provided on the gate electrodes 3. A conductive film made of W or the like for example is used for each gate electrode 3.

First protection films 7 are provided on the semiconductor substrate 1 in such a manner as to cover the gate insulating films 2 and the gate electrodes 3. An insulating film such as a silicon nitride film for example is used for each first protection film 7. The width of each first protection film 7 in the bit line direction is approximately 40 nm for example, and the film thickness of the first protection film 7 from the top of the word line 4 is approximately 50 nm for example. Second protection films 8 are provided on the semiconductor substrate 1 in such a manner as to be in contact with the first protection films 7. An insulating film such as a silicon nitride film for example is used for each second protection film 8.

A barrier metal film (not illustrated) is provided on the source layer S, the drain layer D, and the second protection films 8. A conductive film such as a single layer film made of Ti, TiN, or the like or a laminate film made of Ti and TiN for example is used for the barrier metal film. The barrier metal film prevents direct contact between the semiconductor substrate 1 and each contact plug 9 to be described below, thereby suppressing the diffusion of a metal such as W for example used for the contact plug 9 into the semiconductor substrate 1. Accordingly, the barrier metal film can protect the semiconductor substrate 1 from the contact plug 9.

The contact plug 9 is provided on the barrier metal film in such a manner as to be buried between the paired select transistors. W, Cu, or the like for example is used for the contact plug 9. The contact plug 9 is electrically connected to the drain layer D via the barrier metal film. Moreover, the contact plug 9 is electrically insulated from the word lines 4 since the first protection films 7 and the second protection films 8 are provided as insulating films between the contact plug 9 and the word lines 4. A seam 10 may exist in the contact plug 9 in some cases. For this reason, the surface flatness of the contact plug 9 may not always be excellent. The width of the contact plug 9 in the bit line direction is approximately 50 nm for example, and the film thickness is approximately 200 nm for example.

An amorphous film 11 is provided on one of the first protection films 7 and the contact plug 9. An amorphous silicon oxide film for example is used for the amorphous film 11. It is possible to use some other film such as a metal film as long as the material is amorphous. The film thickness of the amorphous film 11 is approximately 100 to 200 nm for example. Using the amorphous film 11 eliminates the influence of the seam 10 in the contact plug 9. Thus, an amorphous film 11 with excellent surface flatness can be obtained even when the flatness of the contact plug 9 is poor. The surface flatness of the amorphous film 11 is Ra which is equal to 0.2 nm or less for example. Note that the amorphous film 11 may be provided only on the contact plug 9.

A magneto resistive element 18 is provided on the amorphous film 11. The magneto resistive element 18 refers to an element with a structure in which a lower electrode 13, a first magnetic layer 14, a nonmagnetic layer 15, a second magnetic layer 16, and an upper electrode 17 are stacked in the order.

The lower electrode 13 is provided on the amorphous film 11. A conductive film containing at least one of Pt, Ir, Ru, Cu, W, Ta, Ti, Al, Hf, and Sr, a mixture containing at least one of these materials, a nitride containing at least one of the materials, a nitride containing the mixture, or the like is used for the lower electrode 13. The film thickness of the lower electrode 13 is approximately 15 nm for example.

The first magnetic layer 14 is provided on the lower electrode 13. The first magnetic layer 14 is a perpendicular magnetization film for example whose magnetization is oriented substantially perpendicular to the film surface, and is a free layer in which the magnetization orientation is variable. An ordered alloy layer for example is used for the first magnetic layer 14. FePd, FePt, CoPt, CoPd, or the like is used for the layer, but the material is not limited to these materials. When the first magnetic layer 14 is a free layer, the film thickness is approximately 6 nm for example.

Note that the first magnetic layer 14 may be a plane magnetization film whose magnetization is oriented in parallel to the film surface.

The nonmagnetic layer 15 is provided on the first magnetic layer 14 as a tunneling barrier film. The nonmagnetic layer 15 is an oxide material with a NaCl structure for example. MgO, CaO, SrO, TiO, VO, NbO, or the like is used for the nonmagnetic layer 15. Some other material such as $Al_2O_3$ for example may be used instead. The film thickness of the nonmagnetic layer 15 is approximately 10 nm for example.

The second magnetic layer 16 is provided on the nonmagnetic layer 15. The second magnetic layer 16 is a perpendicular magnetization film for example whose magnetization is oriented substantially perpendicular to the film surface, and is a pinned layer in which the magnetization orientation is fixed to one direction. A film of an alloy such as CoCr, CoPt, FePt, FePd, or CoPd is used for the second magnetic layer 16. Alternatively, a laminate film of Co/Pd, Co/Pt, or Co/Ru may be used for the second magnetic layer 16. Note that the second magnetic layer 16 may be a plane magnetization film whose magnetization is oriented parallel to the film surface. When the second magnetic layer 16 is a pinned layer, the film thickness is approximately 30 nm for example.

The upper electrode 17 is provided on the second magnetic layer 16. A single layer film of Ta or a laminate film of Ta/TiAlN is used for the upper electrode 17. Some other film such as a single layer film of Ta, $TiAl_xN_y$, TiN, WN, or W or a laminate film of these materials for example may be used for the upper electrode 17. The film thickness of the upper electrode 17 is approximately 100 nm for example. The upper electrode 17 functions not only as an electrode but also as a hard mask. A sidewall mask 19 is provided in contact with the side surface of each of the upper electrode 17, the second magnetic layer 16, the nonmagnetic layer 15, and the first magnetic layer 14. The bottom surface of the sidewall mask 19 is lower than the bottom surface of the nonmagnetic layer 15, but higher than the bottom surface of the lower electrode 13. Meanwhile, as shown in FIG. 2, when the bottom surface of the sidewall mask 19 is lower than the top surface of the lower electrode 13, a first sidewall contact 20 is not in contact with the side surface of the first magnetic layer 14, thereby preventing magnetic field leakage from the first magnetic layer 14. Note that the bottom surface of the sidewall mask 19 may be lower than the bottom surface of the second magnetic layer 16, but higher than the bottom surface of the nonmagnetic layer 15.

An insulating film of SiN or the like for example is used for the sidewall mask 19. The sidewall mask 19 functions to prevent electrical connection between the first sidewall contact 20 to be described below and the upper electrode 17. The sidewall mask 19 also functions as a hard mask. PCVD (Plasma Chemical Vapor Deposition), ALD (Atomic Layer Deposition), sputtering, and PeALD (Plasma enhanced ALD) are suitable deposition methods for the sidewall mask 19. Moreover, deposition at or below 300° C. can reduce damage on the MTJ element.

The first sidewall contact 20 is provided on the contact plug 9 while being in contact with the side walls of the amorphous film 11 and lower electrode 13. Accordingly, the contact plug 9 and the side surface of the lower electrode 13 are electrically connected to each other. TiN for example is used for the first sidewall contact 20. Note that part of the first sidewall contact 20 connected to the side surface of the lower electrode 13 may be provided on the first protection layer 7 as shown in FIG. 1. ALD, sputtering, and PeALD are suitable deposition methods for the sidewall contact 20. Moreover, deposition at or below 300° C. can reduce damage on the MTJ element.

Further, a first interlayer insulator ILD1, a first interlayer insulator ILD1, a second Interlayer insulator ILD2, a source line contact SC and a source line SL are described in Para 0038.

In the embodiment, the laminate structure is formed to include the free layer, the nonmagnetic layer, and the pinned layer in the order from the top layer. Note, however, that the laminate structure may be formed to include the pinned layer, the nonmagnetic layer, and the free layer in this order from the top layer, in which case appropriate materials should be selected for the upper and lower electrodes.

Next, a method of fabricating the magnetic random access memory according to the first embodiment will be described below by using FIGS. 3A to 5D.

As shown in FIG. 3A, gate insulating films 2 and gate electrodes 3 are formed on a semiconductor substrate 1. Then, word lines 4 are formed on the gate electrodes 3.

Next, as shown in FIG. 3B, a protection film is deposited covering the semiconductor substrate 1, the gate insulating films 2, the gate electrodes 3, and the word lines 4, and is then etched back by RIE (Reactive Ion Etching) or the like to form first protection films 7. Thereafter, with the first protection films 7 as masks, ions are implanted to form extension layers 5 as diffusion layers in upper layer portions of the semiconductor substrate 1.

Next, as shown in FIG. 3C, another protection film is deposited on the semiconductor substrate 1 in such a manner as to be in contact with the first protection films 7, and is then etched back by RIE or the like to form second protection films 8. In this event, the etching is performed until the top surfaces of the first protection films 7 are exposed for example. Thereafter, with the second protection films 8 as masks, ions are implanted to form high-concentration layers 6 as diffusion layers in upper portions of the extension layers 5 in the upper layer portions of the semiconductor substrate 1.

Next, a barrier metal film (not illustrated) is formed on the semiconductor substrate 1. Then, as shown in FIG. 3D, a W film is deposited to be embedded as a contact plug material onto the barrier metal film by CVD (Chemical Vapor Deposition). Thereafter, the contact plug material is polished through CMP (Chemical Mechanical Polishing) until the top surfaces of the first protection films 7 are exposed to thereby form contact plugs 9. Here, the top surface of each contact plug 9 is made lower than the top surface of each first protection film 7. In this process, a seam 10 may be formed in the contact plug 9 in some cases, possibly leading to poor flatness of the contact plug 9.

Figure 4A:
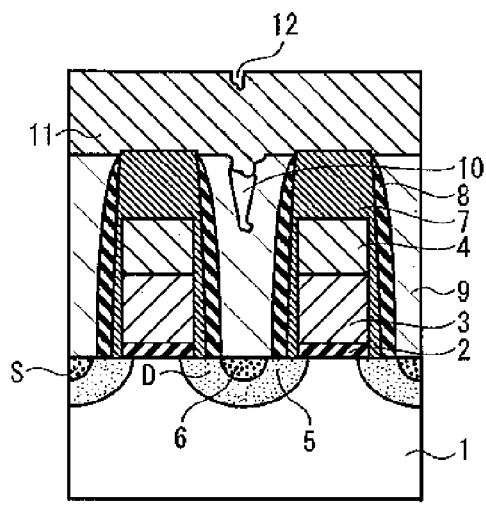
FIGS. 4A-4D are cross-sectional views showing the method of fabricating the magnetic random access memory according to the first embodiment.
Figure 4B:
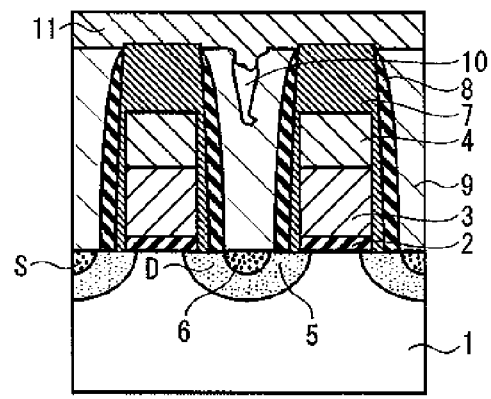
Figure 4C:
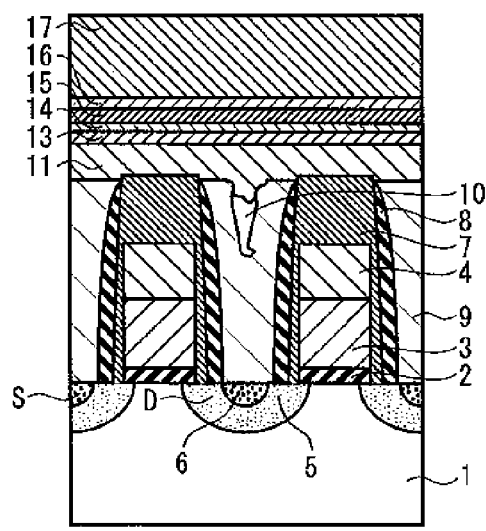

Next, as shown in FIG. 4A, an amorphous silicon oxide film is formed by plasma DVD for example on the first protection films 7 and the contact plug 9 as an amorphous film 11. In this process, a seam 12 may be formed in the top surface of the amorphous film 11 in some cases. Then, as shown in FIG. 4B, the top surface of the amorphous film 11 is planarized through CMP to remove the seam 12 in the top surface of the amorphous film 11. As described below, this allows each magneto resistive element 18 to be formed on a flat surface of the amorphous film 11. In this process, the amorphous film 11 may be filled in the seam 10. Then, as shown in FIG. 4C, the above-mentioned magneto resistive element 18 formed of a lower electrode 13, a first magnetic layer 14, a nonmagnetic layer 15, a second magnetic layer 16, and an upper electrode 17 is provided on the amorphous film 11. Thereafter, a silicon oxide film (not illustrated) is formed by CVD on the upper electrode 17 as a hard mask.

Figure 4D:
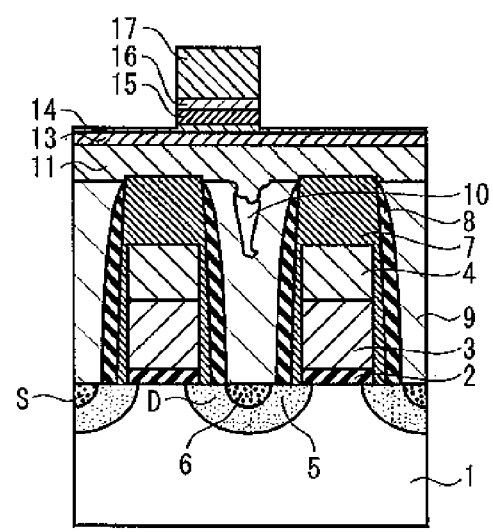

Next, with the silicon oxide film (not illustrated) on the upper electrode 17 as a mask, the upper electrode 17 is etched by RIE. Then, as shown in FIG. 4D, with the silicon oxide film and the upper electrode 17 as masks, the second magnetic layer 16, the nonmagnetic layer 15, and part of the first magnetic layer 14 are etched by RIE, IBE (Ion Beam Etching), or the like. The RIE may be performed under a high-temperature condition of approximately 150 to 300° C. in particular. Note that the etching may be stopped at the top surface of the nonmagnetic layer 15 or of the lower electrode 13.

Figure 5A:
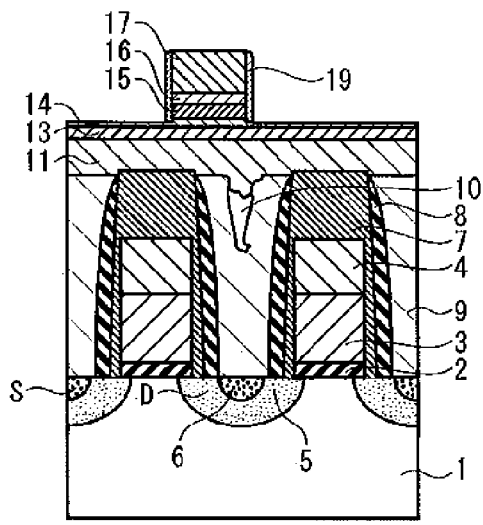
FIGS. 5A-5D are cross-sectional views showing the method of fabricating the magnetic random access memory according to the first embodiment.

Next, a sidewall mask material is formed by the aforementioned PCVD, ALD, sputtering, or PeALD in such a manner as to cover the magneto resistive element 18. Then, the sidewall mask material is etched back to expose the top surface of the upper electrode 17, thereby forming each sidewall mask 19 as shown in FIG. 5A. In this process, the sidewall mask material on the first magnetic layer 14 is etched as well.

Figure 5B:
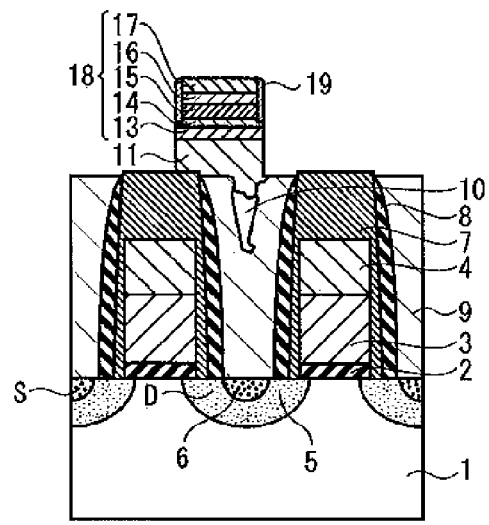

Next, as shown in FIG. 5B, with the upper electrode 17 and the sidewall mask 19 as masks, the first magnetic layer 14, the lower electrode 13, and the amorphous film 11 are etched to expose the contact plug 9 and the first protection films 7.

Note that before forming the sidewall mask 19, the second magnetic layer 16, the nonmagnetic layer 15, the first magnetic layer 14, and part of the lower electrode 13 may be etched and the sidewall mask 19 may be formed thereafter. In this case, the lower electrode 13 and the amorphous film 11 are etched using the upper electrode 17 and the sidewall mask 19 as masks.

Figure 5C:
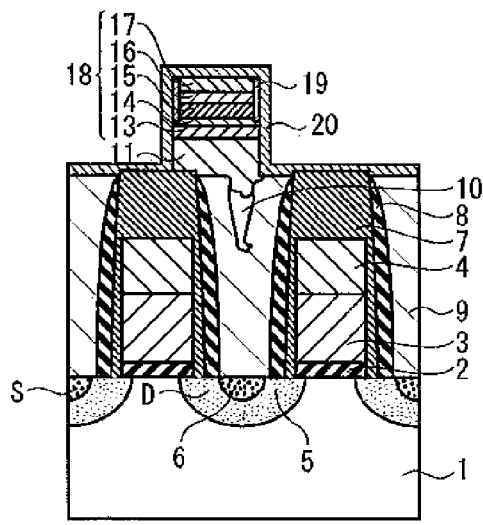

Next, as shown in FIG. 5C, a TiN film for example is deposited as a sidewall contact material through CVD, ALD, or sputtering for example in such a manner as to cover the contact plug 9, the first protection films 7, the amorphous film 11, the sidewall mask 19, and the magneto resistive element 18.

Figure 5D:
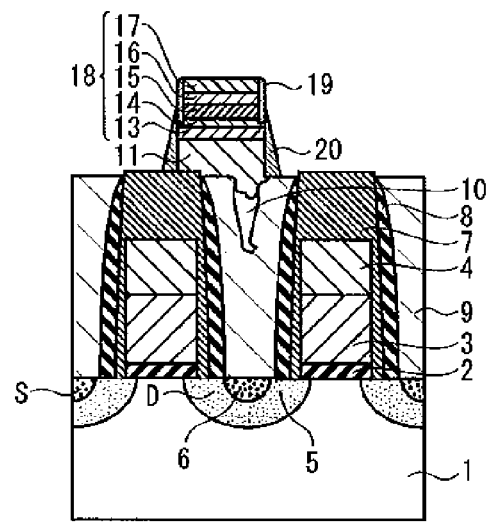

Next, as shown in FIG. 5D, the sidewall contact material is etched back by IBE or RIE to expose the upper electrode 17. As a result, a first sidewall contact 20 that is in contact with the side surfaces of the lower electrode 13 and first magnetic layer 14 is formed on the contact plug 9. The first sidewall contact 20 is configured to electrically connect the contact plug 9 and the side surfaces of the lower electrode 13 and first magnetic layer 14. Note that when the bottom surface of the sidewall mask 19 is lower than the top surface of the lower electrode 13, the first sidewall contact 20 is formed in contact with the side surface of the lower electrode 13 but not in contact with the side surface of the first magnetic layer 14. In this case, the first sidewall contact 20 can prevent magnetic field leakage from the first magnetic layer 14, which in turn prevents deterioration in the magnetization property of the magneto resistive element 18.

Next, a third protection film (not illustrated) is formed covering the top surfaces of the contact plug 9 and first protection films 7, as well as the first sidewall contact 20, the sidewall mask 19, and the upper electrode 17. The third protection film is a single layer film made of any of $Si_xN_y$, $Al_2O_3$, $SiO_2$, $SiAlO$, $TiO_2$, and $ZrO_2$, or a laminated film of two or more of these materials.

Next, process steps are described below in reference to FIG. 1. A first interlayer insulator ILD1 is deposited on the third protection film. Then, the first interlayer insulator ILD1 and the third protection film are polished through CMP until the top surface of the upper electrode 17 is exposed. In this process, the top surface of the interlayer insulator ILD1 is made lower than the top surface of the upper electrode 17. Then, a local wiring LIC is formed covering the top surface of the upper electrode 17, and thereafter a second interlayer insulator ILD2 is deposited covering the local wiring LIC. Subsequently, a source line contact SC, a bit line contact BC (not illustrated), a source line SL, and a bit line BL (not illustrated) are formed. As a result, a magnetic random access memory according to the first embodiment is formed as illustrated.

As described above, in the first embodiment, the amorphous film 11 having excellent surface flatness is provided on the contact plug 9 and the first protection film 7, and the magneto resistive element 18 is provided on the amorphous film 11. Hence, the magneto resistive element 18 is provided without any stepped portion. Accordingly, a magnetic random access memory can be obtained without reliability degradation.

Further, in the first embodiment, the sidewall contact material is deposited covering the contact plug 9, the first protection films 7, the amorphous film 11, and the magneto resistive element 18, and then etched back to form the first sidewall contact 20 that electrically connects the contact plug 9 and the side surface of the lower electrode 13 with each other. Hence, by changing the film thickness of the sidewall contact material, the electrical connection between the first sidewall contact 20 and the side surface of the lower electrode 13 can be controlled and maintained in a preferable state.

(Second Embodiment)

Figure 6:
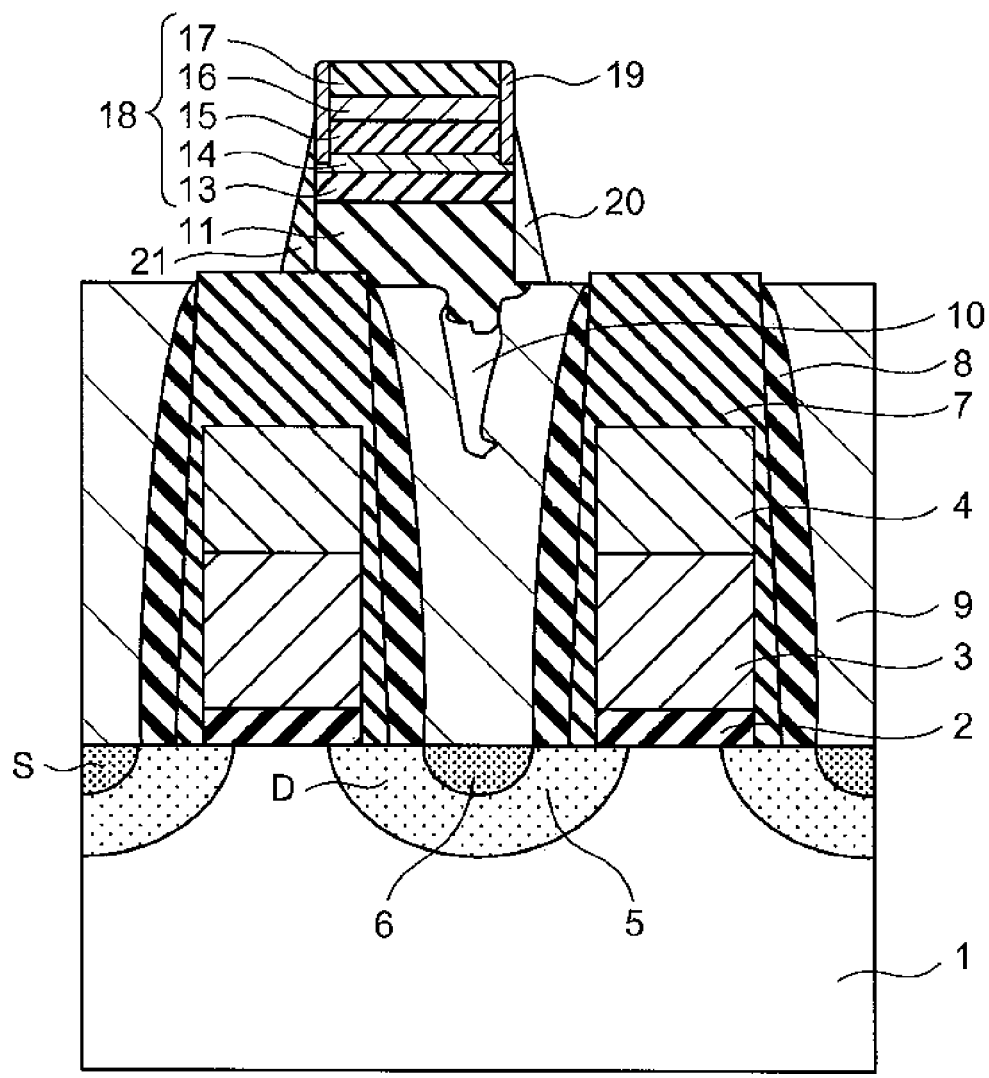
FIG. 6 is a cross-sectional view showing a method of fabricating a magnetic random access memory according to a second embodiment.

A method of fabricating a magnetic random access memory according to a second embodiment of the invention will be described by using FIG. 6. FIG. 6 is a cross-sectional view showing a method of fabricating the magnetic random access memory according to the second embodiment. In the configuration of the second embodiment, portions that are identical to those in the configuration of the magnetic random access memory of the first embodiment shown in FIG. 1 are denoted by the same reference signs, and detailed description thereof is omitted.

In the first embodiment, the first sidewall contact 20 is formed by depositing a sidewall contact material to cover the first protection films 7, the contact plug 9, the amorphous film 11, the magneto resistive element 18, and the sidewall mask 19 and then etching back the sidewall contact material. In the second embodiment, the first sidewall contact 20 is formed by subjecting the contact plug 9 to physical etching to deposit a sidewall contact material onto the contact plug 9.

Like the first embodiment, as shown in FIGS. 3A to 4D, select transistors are formed on a semiconductor substrate 1, and then an amorphous film 11, a magneto resistive element 18, and a sidewall mask 19 are formed on a contact plug 9 and a first protection film 7.

Next, the contact plug 9 is processed by a physical process such as ion milling. The process is performed until a contact plug material deposited onto the contact plug 9 by the sputtering effect comes into contact with the side surface of the lower electrode 13. Consequently, a first sidewall contact 20 is formed which electrically connects the contact plug 9 and the side surface of the lower electrode 13 to each other, as shown in FIG. 6. In this case, the contact plug 9 and the first sidewall contact 20 are made of the same material such as W for example. Meanwhile, when the first protection film 7 is subjected to the physical process, the material of the first protection film 7, which is SiN for example, is deposited onto the side surfaces of the amorphous film 11 and lower electrode 13 as a deposition layer 21. Note that the material of the first sidewall contact 20 and the material of the deposition layer 21 both contain part of the material of the first protection layer 7 and part of the material of the contact plug 9. Incidentally, IBE may be performed as the physical process. Moreover, instead of the physical process, RIE may be performed under a high-bias condition to process the contact plug 9.

Thereafter, the same processes as the first embodiment are performed to form the magnetic random access memory.

As described above, in the second embodiment, the amorphous film 11 having excellent surface flatness is provided on the contact plug 9 and the first protection film 7, and the magneto resistive element 18 is provided on the amorphous film 11. Hence, the magneto resistive element 18 is provided without any stepped portion. Accordingly, a magnetic random access memory can be obtained without reliability degradation.

Further, in the second embodiment, the first sidewall contact 20 is formed without depositing the sidewall contact material used in the first embodiment. In other words, use of the method of fabricating a magnetic random access memory according to the second embodiment makes it possible to reduce the number of fabrication steps and therefore lowers the fabrication cost.

(Third Embodiment)

Figure 7:
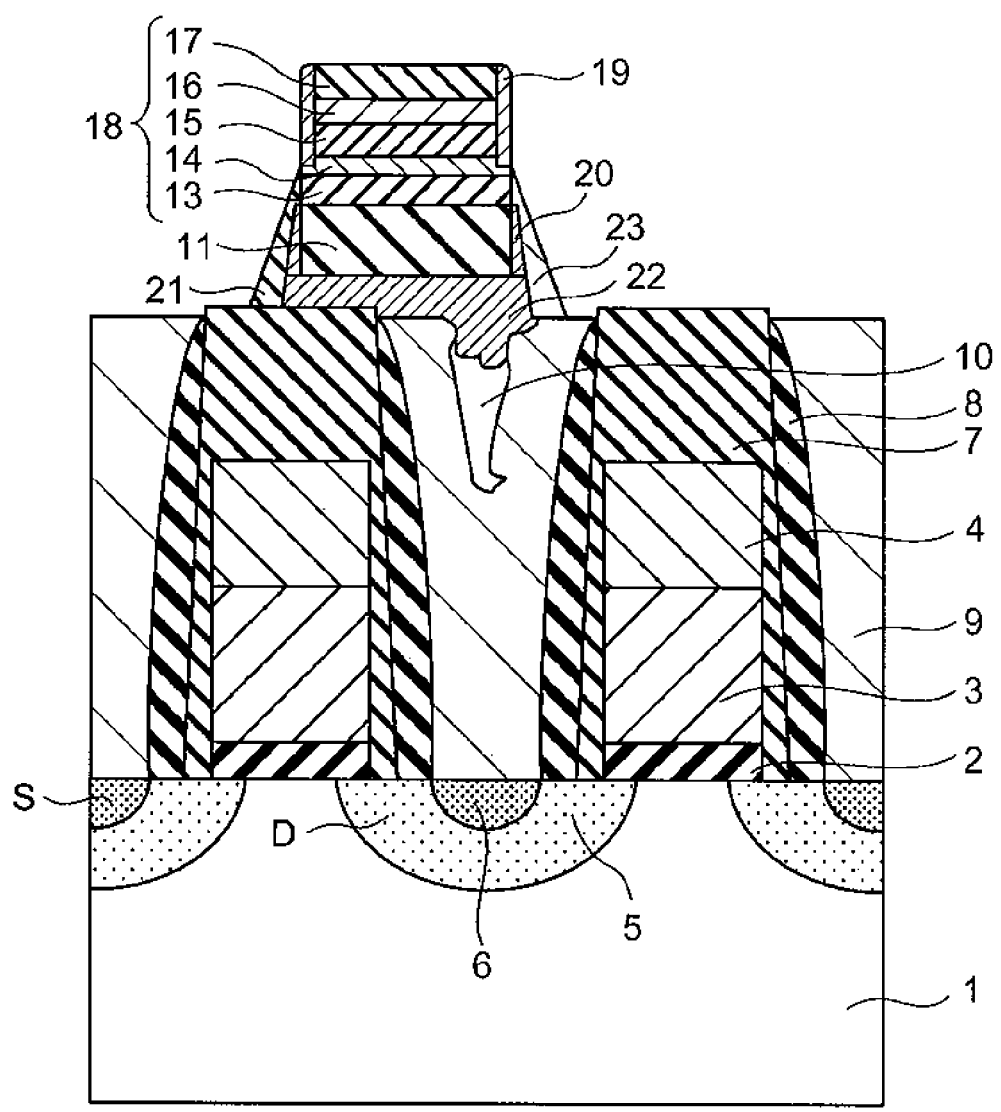
FIG. 7 is a cross-sectional view showing a magnetic random access memory according to a third embodiment.

A magnetic random access memory according to a third embodiment will be described by using FIG. 7. FIG. 7 is a cross-sectional view showing the magnetic random access memory according to the third embodiment. In the configuration of the third embodiment, portions that are identical to those in the configuration of the magnetic random access memory of the first embodiment shown in FIG. 1 are denoted by the same reference signs, and detailed description thereof is omitted.

The third embodiment differs from the first embodiment in that a metal film 22 is provided between the contact plug 9 and first protection film 7 and the amorphous film 11 shown in FIG. 1. In this case, the first sidewall contact 20 is mainly made of the material of the metal film 22. In addition, the first sidewall contact 20 also contains the material of the contact plug 9 and the material of the first protection film 7. Note that a second sidewall contact 23 may be provided in contact with the first sidewall contact 20. The composition of the second sidewall contact 23 is mainly the same as that of the material of the contact plug 9. The material of the contact plug 9 contains part of the material of the contact plug 9 and part of the material of the first protection film 7.

A method of fabricating the magnetic random access memory according to the third embodiment will be described by using FIG. 8. FIG. 8 is a cross-sectional view showing a method of fabricating the magnetic random access memory according to the third embodiment.

Like the first embodiment, as shown in FIGS. 3A to 3D, select transistors, first protection films 7, and a contact plug 9 are formed on a semiconductor substrate 1.

Figures 8A, 8B:
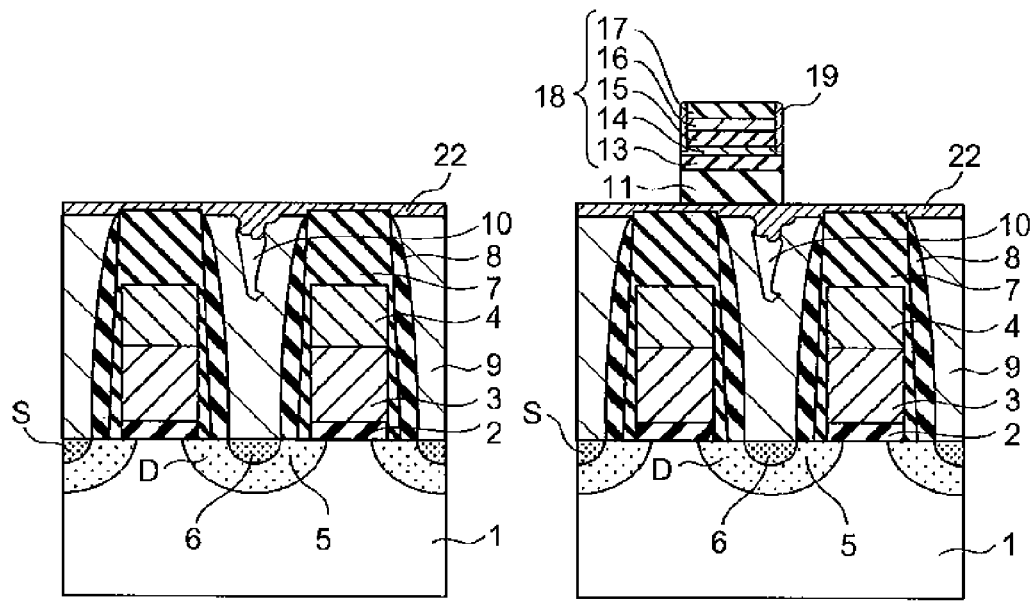
FIGS. 8A-8C are cross-sectional views showing a method of fabricating the magnetic random access memory according to the third embodiment.

Next, as shown in FIG. 8A, a metal film 22 is formed on the first protection films 7 and the contact plug 9. In this process, the metal film 22 may be filled in the seam 10. A metal such as Ta, Pt, TiN, W, or TiAlN for example is used for the metal film 22. The surface flatness of the metal film 22 is affected by the contact plug 9 and therefore may not always be excellent.

Next, as shown in FIG. 8B, an amorphous film 11 is formed on the metal film 22. Then, like the first embodiment, a magneto resistive element 18 and a sidewall mask 19 are formed on the amorphous film 11. Further, with the upper electrode 17 and the sidewall mask 19 as masks, the amorphous film 11 is etched until the metal film 22 is exposed.

Figure 8C:
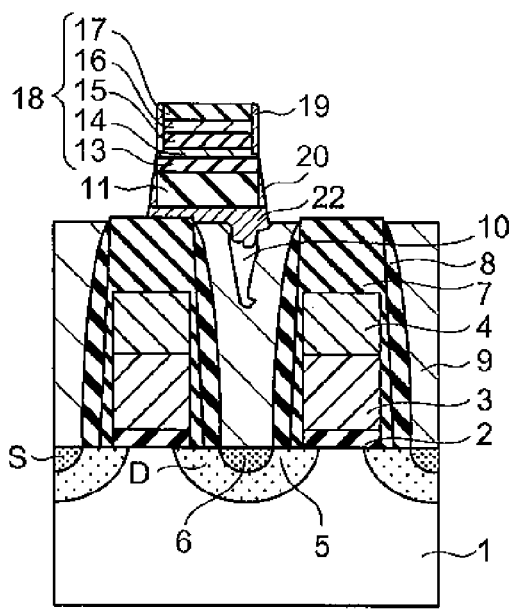

Next, as shown in FIG. 8C, the metal film 22 is processed by a physical process such as ion milling. By the sputtering effect, a metal having the same composition as the metal film 22 is deposited on the contact plug 9. As a result, a first sidewall contact 20 is formed on the contact plug 9 in such a manner as to be in contact with the side surface of the lower electrode 13. Note that when the first sidewall contact 20 is not in contact with the side surface of the lower electrode 13, the contact plug 9 may also be subjected to a physical process to deposit a contact plug material onto the first sidewall contact 20 and form a second sidewall contact 23 made of W for example. This makes it possible to maintain excellent electrical connection between the contact plug 9 and the side surface of the lower electrode 13. In a case where the first protection film 7 is processed, a deposition layer 21 of SiN for example, which is as the material of the first protection film 7, is deposited on the first sidewall contact 20.

Thereafter, the same process steps as the first embodiment are performed to form the magnetic random access memory.

As described above, in the third embodiment, the amorphous film 11 having excellent surface flatness is provided on the metal film 22, and the magneto resistive element 18 is provided on the amorphous film 11. Hence, the magneto resistive element 18 is provided without any stepped portion.

Accordingly, a magnetic random access memory can be obtained without reliability degradation.

Further, in the third embodiment, the metal film 22, which has a large contact area with the contact plug 9, is provided on the contact plug 9 and the first protection film 7. Accordingly, it is possible to maintain excellent electrical connection between the contact plug 9 and the first sidewall contact 20.

Furthermore, in the third embodiment, the metal film 22 is subjected to a physical process to form the first sidewall contact 20 that electrically connects the contact plug 9 and the side surface of the lower electrode 13 with each other. Hence, by changing the film thickness of the metal film 22, the electrical connection between the first sidewall contact 20 and the side surface of the lower electrode 13 can be controlled and maintained in a preferable state.

The foregoing first to third embodiments have been described on the assumption that planar select transistors are formed on the semiconductor substrate 1. However, three-dimensional select transistors such as FINFETs (Fin Field Effect Transistors) for example may be provided instead of the planar transistors.

The foregoing first to third embodiments have been described on the assumption that a free layer is used for the first magnetic layer 14 and a pinned layer is used for the second magnetic layer 16. However, a pinned layer may be used for the first magnetic layer 14 and a free layer may be used for the second magnetic layer 16 instead.

In the foregoing first to third embodiments, an alignment control film may be provided between the lower electrode 13 and the first magnetic layer 14. A film made of Pt, Ir, Ru, or the like, or a laminate film made of these atoms for example is used for the alignment control film.

In the foregoing first to third embodiments, a magnetization adjustment layer may be provided between the second magnetic layer 16 and the upper electrode 17. The magnetization adjustment layer is an antiferromagnetic film provided to adjust magnetic field leakage from the pinned layer, suppress a magnetic influence on the free layer, and also fix the magnetization orientation of the pinned layer to a predetermined one orientation. An alloy of Mn with Fe, Ni, Pt, Pd, Ru, Os, or Ir, namely FeMn, NiMn, PtMn, PdMn, PtPdMn, RuMn, OsMn, IrMn, CrPtMn, or the like for example is used for the magnetization adjustment layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory, comprising:
   a semiconductor substrate;
   a selection transistor provided on the semiconductor substrate, the selection transistor including a diffusion layer on a surface area of the semiconductor substrate;
   a contact plug provided on the diffusion layer;
   an amorphous film provided on the contact plug;
   a lower electrode provided on the amorphous film;
   a first magnetic layer provided on the lower electrode;
   a nonmagnetic layer provided on the first magnetic layer;
   a second magnetic layer provided on the nonmagnetic layer;
   an upper electrode provided on the second magnetic layer;
   a sidewall mask provided in contact with sidewalls of the upper electrode; and
   a sidewall contact film provided on the contact plug, the sidewall contact film being in contact with a sidewall of the lower electrode.

2. The magnetic random access memory of claim 1, wherein the sidewall mask is in contact with the sidewalls of the upper electrode, the second magnetic layer and the nonmagnetic layer, a height of a bottom surface of the sidewall mask being lower than a height of a bottom surface of the second magnetic layer and being higher than a height of a bottom surface of the nonmagnetic layer.

3. The magnetic random access memory of claim 1, wherein the sidewall mask is in contact with the sidewalls of the upper electrode, the second magnetic layer and the nonmagnetic layer, and a sidewall of the first magnetic layer, a height of a bottom surface of the sidewall mask being lower than the height of the bottom surface of the nonmagnetic layer and being higher than a height of a bottom surface of the first magnetic layer.

4. The magnetic random access memory of claim 1, wherein the sidewall mask is in contact with the sidewalls of the upper electrode, the second magnetic layer, the nonmagnetic layer, the first magnetic layer, and a portion of the sidewall of the lower electrode, a height of a bottom surface of the sidewall mask is lower than the height of the bottom surface of the first magnetic layer and is higher than a height of a bottom surface of the lower electrode.

5. The magnetic random access memory of claim 1, wherein the sidewall contact film is composed of a titanium nitride film.

6. The magnetic random access memory of claim 1, wherein a seam is provided in the contact plug and the amorphous film is provided in at least a portion of the seam.

7. The magnetic random access memory of claim 1, wherein a surface asperity of the amorphous film is 0.2 nm or less.

8. The magnetic random access memory of claim 1, further comprising a metal film provided between the contact plug and the amorphous film, the sidewall contact film including metal composing the metal film.

9. The magnetic random access memory of claim 8, wherein the sidewall contact film is constituted with a first sidewall contact film and a second sidewall contact film, the first sidewall contact film is in contact with the sidewall of lower electrode and the second sidewall contact film is in contact with a sidewall of the first sidewall contact film.

10. The magnetic random access memory of claim 9, wherein the second sidewall contact film includes metal composing the contact plug.

11. The magnetic random access memory of claim 8, wherein the first sidewall contact film is composed of a titanium nitride film.

12. The magnetic random access memory of claim 8, wherein the seam is provided in the contact plug and the metal film is provided in at least a portion of the seam.

* * * * *